(12) United States Patent
Shimizu et al.

(10) Patent No.: US 10,714,610 B2
(45) Date of Patent: Jul. 14, 2020

(54) SEMICONDUCTOR DEVICE, METHOD FOR MANUFACTURING SEMICONDUCTOR DEVICE, INVERTER CIRCUIT, DRIVING DEVICE, VEHICLE, AND ELEVATOR

(71) Applicant: Kabushiki Kaisha Toshiba, Minato-ku (JP)

(72) Inventors: Tatsuo Shimizu, Shinagawa (JP); Ryosuke Iijima, Setagaya (JP); Toshihide Ito, Shibuya (JP); Shunsuke Asaba, Kawasaki (JP); Yukio Nakabayashi, Yokohama (JP); Shigeto Fukatsu, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 128 days.

(21) Appl. No.: 16/113,304

(22) Filed: Aug. 27, 2018

(65) Prior Publication Data
US 2019/0296146 A1    Sep. 26, 2019

(30) Foreign Application Priority Data

Mar. 21, 2018   (JP) ................. 2018-053609

(51) Int. Cl.
*H01L 29/78*    (2006.01)
*H01L 29/167*   (2006.01)
(Continued)

(52) U.S. Cl.
CPC ........ *H01L 29/7811* (2013.01); *B66B 11/043* (2013.01); *H01L 21/046* (2013.01);
(Continued)

(58) Field of Classification Search
CPC ........... H01L 21/02529; H01L 29/1608; H01L 21/02378; H01L 21/02447
See application file for complete search history.

(56) References Cited

U.S. PATENT DOCUMENTS 7,394,070 B2 *   7/2008   Nozoe ................. G01R 31/307
                                                                250/306
8,624,401 B2 *   1/2014   Ishikawa ................. H01L 22/34
                                                                257/686

(Continued)

FOREIGN PATENT DOCUMENTS

JP    2014-078727    5/2014
JP    2015-146450    8/2015
(Continued)

OTHER PUBLICATIONS

Koutarou Kawahara, et al., "Detection and depth analyses of deep levels generated by ion implantation in n- and p-type 4H-SiC," Journal of Applied Physics 106, 2009, 7 Pages.

(Continued)

*Primary Examiner* — Earl N Taylor
(74) *Attorney, Agent, or Firm* — Oblon, McClelland, Maier & Neustadt, L.L.P.

(57) ABSTRACT

A semiconductor device of an embodiment includes a silicon carbide layer; a gate electrode; a gate insulating layer disposed between the silicon carbide layer and the gate electrode; a first region disposed in the silicon carbide layer and containing nitrogen (N); and a second region disposed between the first region and the gate insulating layer, and containing at least one element selected from the group consisting of nitrogen (N), phosphorus (P), arsenic (As), antimony (Sb), scandium (Sc), yttrium (Y), lanthanum (La), lanthanoids (Ce, Pr, Nd, Pm, Sm, Eu, Gd, Tb, Dy, Ho, Er, Tm, Yb, Lu), hydrogen (H), deuterium (D), and fluorine (F).

23 Claims, 13 Drawing Sheets

(51) Int. Cl.

| | | |
|---|---|---|
| *H01L 29/36* | (2006.01) | |
| *H01L 29/66* | (2006.01) | |
| *H01L 21/04* | (2006.01) | |
| *H01L 29/739* | (2006.01) | |
| *B66B 11/04* | (2006.01) | |
| *H01L 29/16* | (2006.01) | |
| *B61C 3/00* | (2006.01) | |
| *H01L 29/10* | (2006.01) | |
| *H01L 29/08* | (2006.01) | |
| *H01L 21/02* | (2006.01) | |
| *H01L 29/49* | (2006.01) | |
| *H01L 29/45* | (2006.01) | |
| *H02M 7/537* | (2006.01) | |
| *H02P 27/06* | (2006.01) | |
| *B60R 16/023* | (2006.01) | |

(52) U.S. Cl.
CPC .......... *H01L 21/049* (2013.01); *H01L 29/167* (2013.01); *H01L 29/1608* (2013.01); *H01L 29/36* (2013.01); *H01L 29/66068* (2013.01); *H01L 29/66712* (2013.01); *H01L 29/7395* (2013.01); *H01L 29/7813* (2013.01); *B60R 16/023* (2013.01); *B61C 3/00* (2013.01); *H01L 21/02164* (2013.01); *H01L 21/02271* (2013.01); *H01L 21/02378* (2013.01); *H01L 21/02529* (2013.01); *H01L 21/02609* (2013.01); *H01L 21/02634* (2013.01); *H01L 21/02664* (2013.01); *H01L 29/0804* (2013.01); *H01L 29/086* (2013.01); *H01L 29/0821* (2013.01); *H01L 29/0878* (2013.01); *H01L 29/1095* (2013.01); *H01L 29/45* (2013.01); *H01L 29/4916* (2013.01); *H01L 29/66333* (2013.01); *H02M 7/537* (2013.01); *H02P 27/06* (2013.01)

(56) References Cited

U.S. PATENT DOCUMENTS

| | | | | |
|---|---|---|---|---|
| 8,796,686 | B2* | 8/2014 | Yang | H01L 23/585 |
| | | | | 257/48 |
| 8,872,348 | B2* | 10/2014 | Yoo | H01L 22/14 |
| | | | | 257/774 |
| 9,006,739 | B2* | 4/2015 | Crain, Jr. | H01L 22/34 |
| | | | | 257/48 |
| 9,287,184 | B2* | 3/2016 | Dennison | H01L 22/14 |
| 9,291,669 | B2* | 3/2016 | Lee | G01R 31/2884 |
| 9,324,826 | B2* | 4/2016 | Shimizu | H01L 29/66068 |
| 9,496,365 | B2* | 11/2016 | Shimizu | H01L 21/045 |
| 9,557,376 | B2* | 1/2017 | Dennison | H01L 22/14 |
| 9,768,129 | B2* | 9/2017 | Lee | H01L 23/573 |
| 9,837,270 | B1 | 12/2017 | Varadarajan | H01L 21/76826 |
| 10,211,301 | B1 | 2/2019 | Shimizu | H01L 29/408 |
| 10,217,811 | B1* | 2/2019 | Shimizu | H01L 29/0619 |
| 10,319,819 | B2* | 6/2019 | Shimizu | H01L 29/045 |
| 10,396,163 | B2* | 8/2019 | Wada | C23C 16/325 |
| 2006/0163477 | A1* | 7/2006 | Nozoe | G01R 31/307 |
| | | | | 250/310 |
| 2006/0189007 | A1* | 8/2006 | Aoki | H01L 22/34 |
| | | | | 438/14 |
| 2007/0262370 | A1* | 11/2007 | Okada | H01L 21/78 |
| | | | | 257/315 |
| 2008/0012572 | A1* | 1/2008 | Tsukuda | G01R 31/2884 |
| | | | | 324/522 |
| 2008/0203388 | A1* | 8/2008 | He | H01L 22/32 |
| | | | | 257/48 |
| 2009/0201043 | A1* | 8/2009 | Kaltalioglu | G01R 31/2858 |
| | | | | 324/750.3 |
| 2011/0221460 | A1* | 9/2011 | Trebo | G01R 31/2884 |
| | | | | 324/750.3 |
| 2012/0199846 | A1* | 8/2012 | Shimizu | H01L 29/66068 |
| | | | | 257/77 |
| 2012/0292759 | A1* | 11/2012 | Ishikawa | H01L 22/34 |
| | | | | 257/737 |
| 2013/0048980 | A1* | 2/2013 | Yang | H01L 23/585 |
| | | | | 257/48 |
| 2013/0069206 | A1* | 3/2013 | Yoshizawa | H01L 22/34 |
| | | | | 257/620 |
| 2013/0270558 | A1* | 10/2013 | Crain, Jr. | H01L 22/34 |
| | | | | 257/48 |
| 2013/0277857 | A1* | 10/2013 | Yoo | H01L 22/14 |
| | | | | 257/774 |
| 2014/0151702 | A1* | 6/2014 | Ishikawa | H01L 22/34 |
| | | | | 257/48 |
| 2014/0232001 | A1* | 8/2014 | Gratz | H01L 21/768 |
| | | | | 257/762 |
| 2015/0011028 | A1* | 1/2015 | Yoo | H01L 22/14 |
| | | | | 438/17 |
| 2015/0084068 | A1* | 3/2015 | Shimizu | H01L 21/045 |
| | | | | 257/77 |
| 2015/0113343 | A1* | 4/2015 | Lee | G01R 31/2884 |
| | | | | 714/727 |
| 2015/0214047 | A1* | 7/2015 | Hama | H01L 21/02332 |
| | | | | 438/285 |
| 2015/0303271 | A1* | 10/2015 | Tanaka | H01L 29/78 |
| 2016/0087044 | A1* | 3/2016 | Iijima | H01L 29/7828 |
| | | | | 257/77 |
| 2016/0087045 | A1* | 3/2016 | Shimizu | H01L 21/049 |
| | | | | 257/77 |
| 2016/0197056 | A1* | 7/2016 | Bhowmik | H01L 22/34 |
| | | | | 257/48 |
| 2016/0211187 | A1* | 7/2016 | Zhang | G06F 30/398 |
| 2016/0218069 | A1* | 7/2016 | Yoshizawa | H01L 22/34 |
| 2016/0247884 | A1* | 8/2016 | Ohashi | H01L 21/049 |
| 2016/0247907 | A1* | 8/2016 | Ohashi | H01L 29/7802 |
| 2016/0285445 | A1* | 9/2016 | Takao | H05K 7/1432 |
| 2016/0300800 | A1* | 10/2016 | Zeng | H01L 23/562 |
| 2017/0104072 | A1* | 4/2017 | Shimizu | H01L 29/7802 |
| 2017/0110544 | A1* | 4/2017 | Hoshi | H01L 29/7805 |
| 2017/0125360 | A1* | 5/2017 | Lee | H01L 23/573 |
| 2017/0256504 | A1* | 9/2017 | Minami | G01R 31/2644 |
| 2017/0263745 | A1* | 9/2017 | Kinoshita | H01L 29/0878 |
| 2017/0263782 | A1* | 9/2017 | Yamazaki | H01L 29/78648 |
| 2017/0263880 | A1* | 9/2017 | Lee | H01L 27/3244 |
| 2017/0271507 | A1* | 9/2017 | Suzuki | H01L 29/1608 |
| 2017/0288025 | A1* | 10/2017 | Hori | H01L 21/02433 |
| 2017/0345657 | A1* | 11/2017 | Shimizu | H01L 29/1608 |
| 2017/0345903 | A1* | 11/2017 | Shimizu | H01L 29/513 |
| 2017/0365664 | A1* | 12/2017 | Iijima | H01L 29/4925 |
| 2018/0083112 | A1* | 3/2018 | Shimizu | H01L 29/408 |
| 2018/0138288 | A1* | 5/2018 | Utsumi | H01L 21/3065 |
| 2018/0233574 | A1* | 8/2018 | Morisette | H01L 21/0475 |
| 2018/0308937 | A1* | 10/2018 | Hirose | H01L 21/049 |
| 2018/0315723 | A1* | 11/2018 | Singh | H01L 24/06 |
| 2018/0347035 | A1* | 12/2018 | Weimer | H01L 21/3105 |
| 2019/0011496 | A1* | 1/2019 | Van Gemert | H01L 21/78 |
| 2019/0067424 | A1* | 2/2019 | Kudou | H01L 29/0856 |
| 2019/0148322 | A1* | 5/2019 | Singh | G06F 30/398 |
| | | | | 257/773 |
| 2019/0229065 | A1* | 7/2019 | Kim | H01L 23/528 |
| 2019/0235017 | A1* | 8/2019 | Roh | G01R 31/2607 |
| 2019/0250208 | A1* | 8/2019 | Dhanasekaran | G01R 31/2884 |
| 2019/0296146 | A1* | 9/2019 | Shimizu | H01L 29/105 |

FOREIGN PATENT DOCUMENTS

| | | |
|---|---|---|
| JP | 2016-018860 | 2/2016 |
| JP | 2017-204644 | 11/2017 |

OTHER PUBLICATIONS

U.S. Appl. No. 15/386,099, filed Dec. 21, 2016, 2017/0104072 A1, Tatsuo Shimizu, et al.

* cited by examiner

SEMICONDUCTOR DEVICE, METHOD FOR MANUFACTURING SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2018-053609, filed on Mar. 21, 2018, the entire contents of which are incorporated herein by reference.

FIELD

Embodiments described herein relate generally to a semiconductor device, a method for manufacturing a semiconductor device, an inverter circuit, a driving device, a vehicle, and an elevator.

BACKGROUND

Silicon carbide (SiC) is expected to be a material for next generation semiconductor devices. In comparison to silicon (Si), silicon carbide exhibits excellent physical properties such as a band gap of three times larger than that of Si, a breakdown field strength of about ten times larger than that of Si, and a thermal conductivity of about three times larger than that of Si. By utilizing these properties, it is possible to fabricate a low-loss semiconductor device capable of operating at high temperatures.

However, in forming a metal oxide semiconductor field effect transistor (MOSFET), for example, using silicon carbide, carrier mobility is lowered.

11A and 11B are explanatory views and graphs for explaining the function of the semiconductor device and the method for manufacturing the semiconductor device of the first embodiment.

Figure 12:
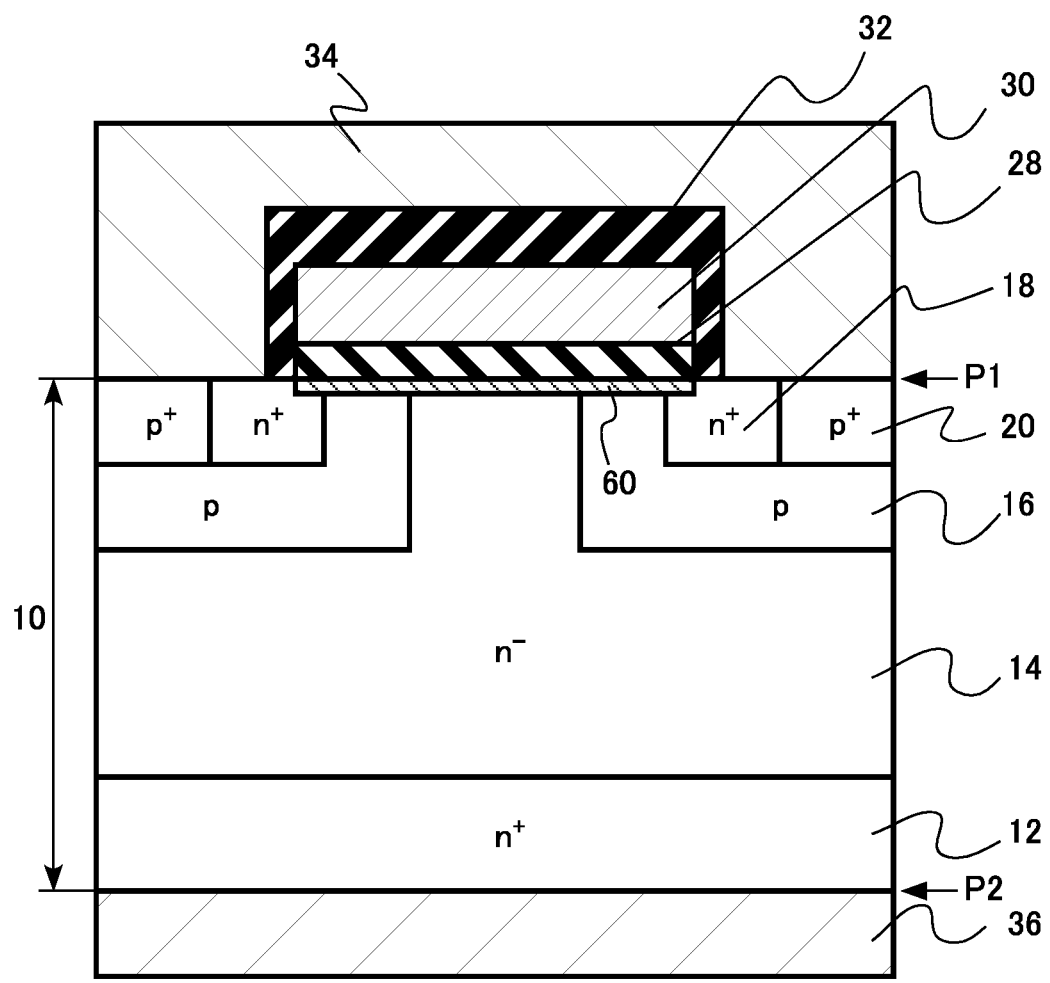
Figure 13:
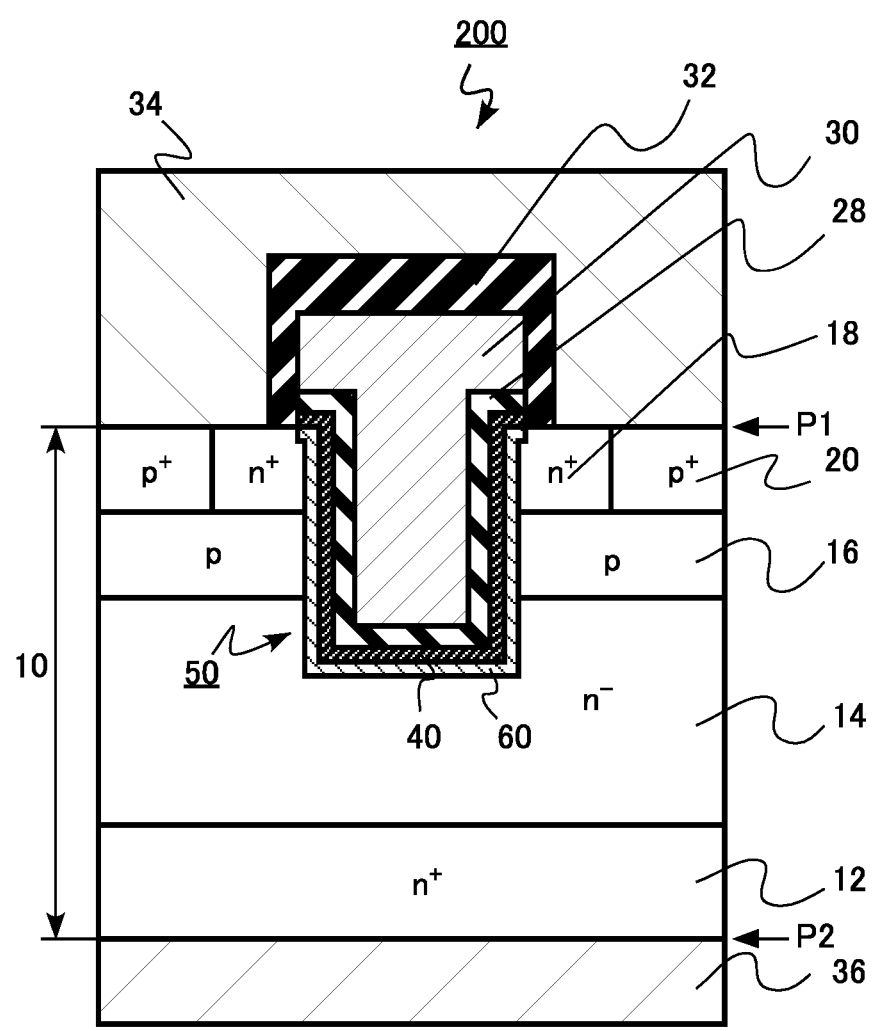
Figure 14:
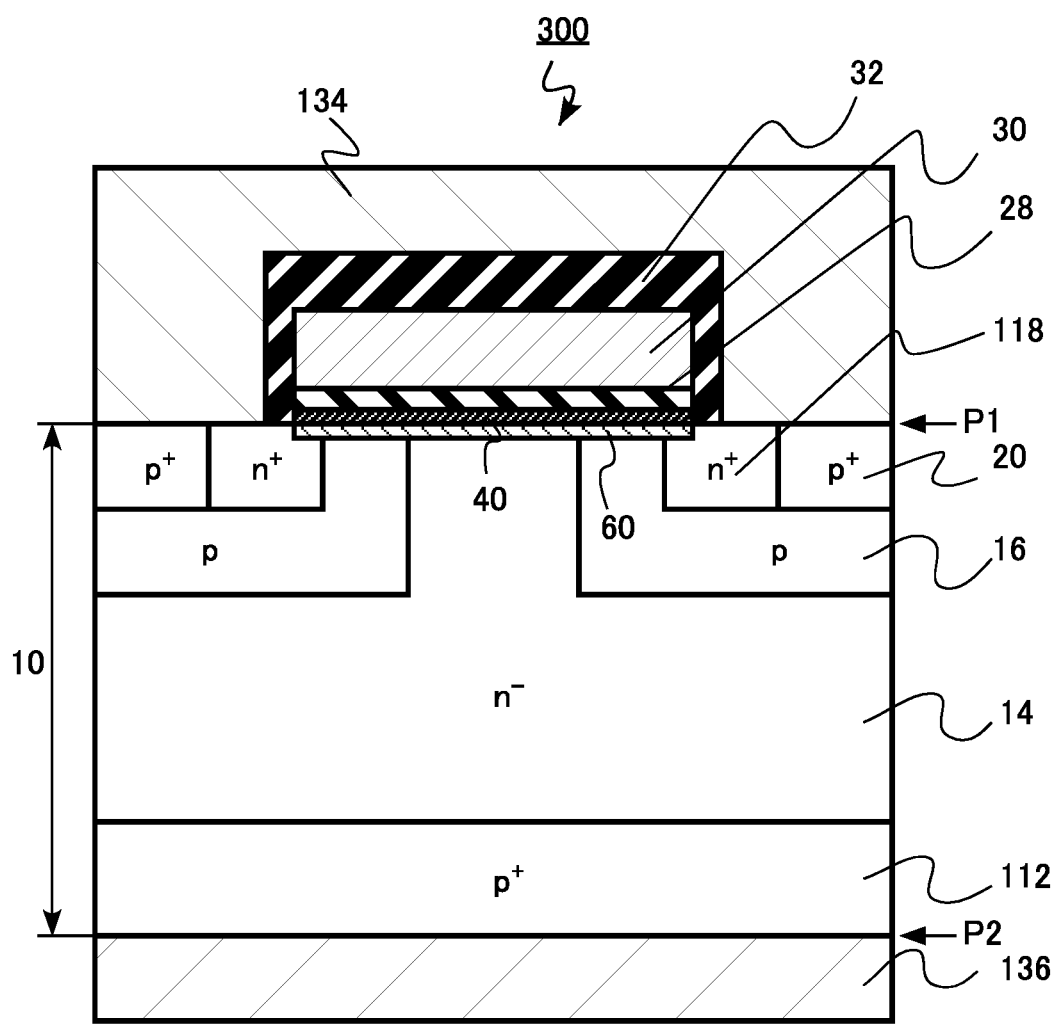
Figure 15:
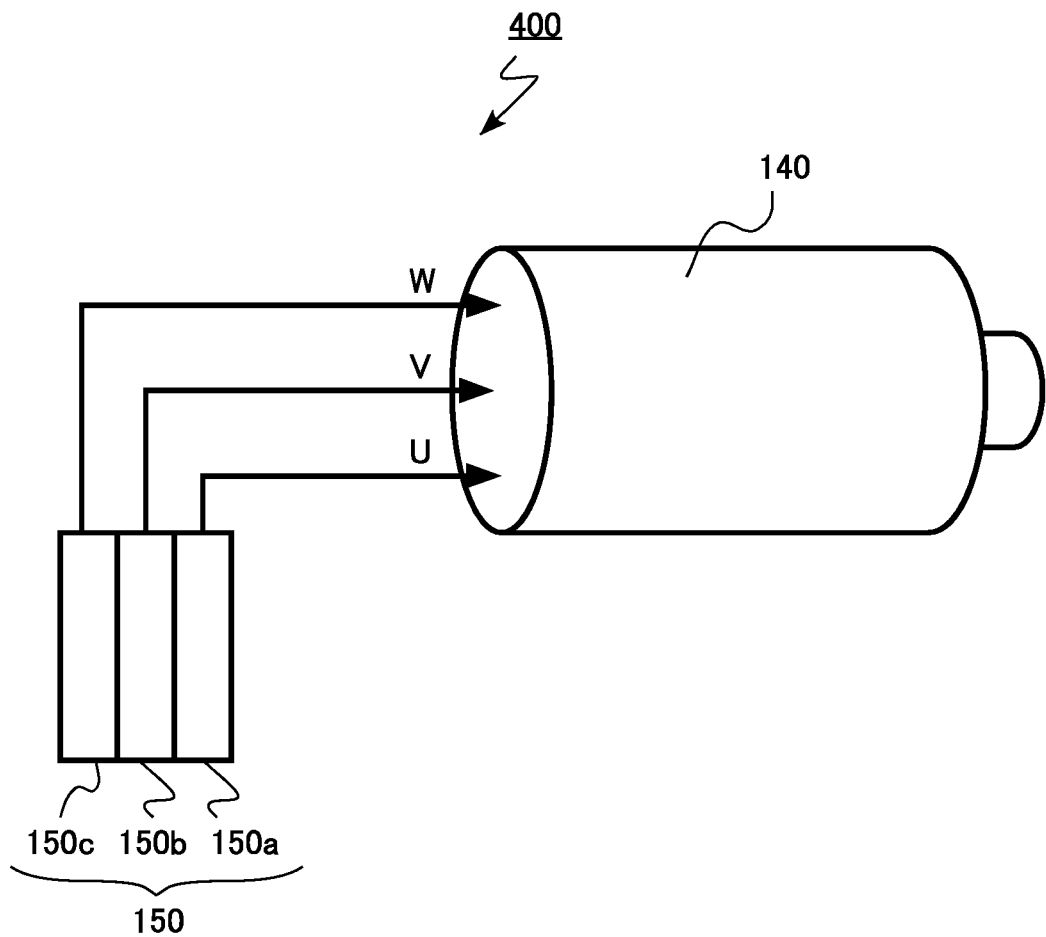
Figure 16:
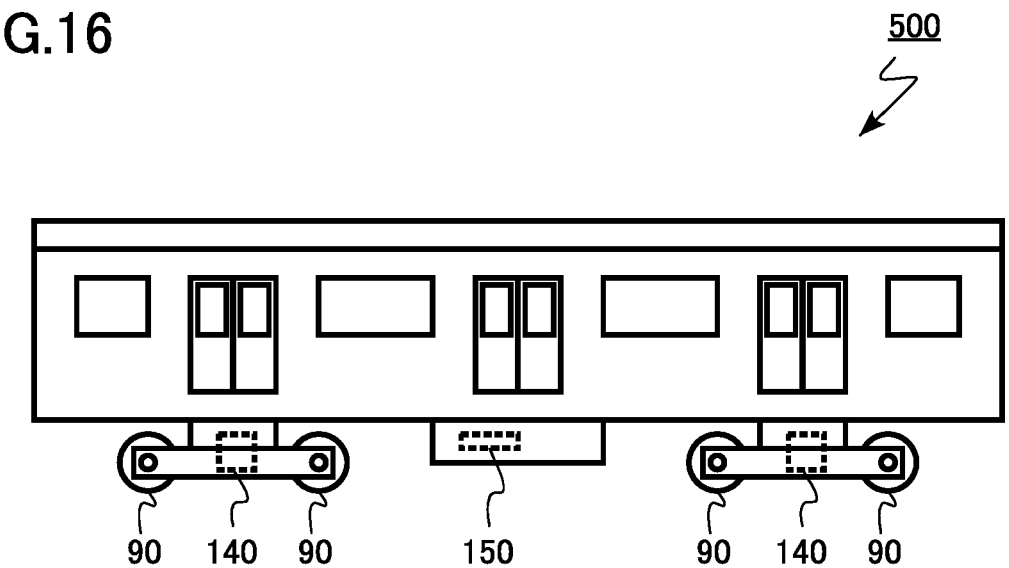
Figure 17:
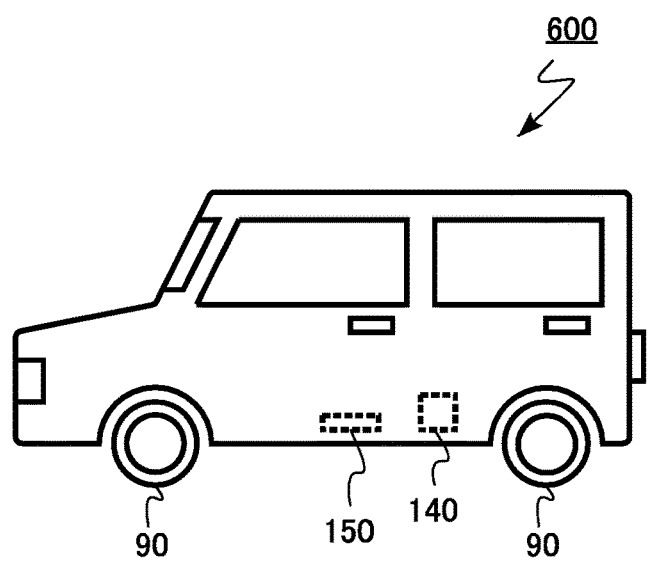

FIG. 12 is a schematic cross-sectional view of the semiconductor device of the first embodiment;

FIG. 13 is a schematic cross-sectional view of a semiconductor device of a second embodiment;

FIG. 14 is a schematic cross-sectional view of a semiconductor device of a third embodiment;

FIG. 15 is a schematic diagram of a driving device of a fourth embodiment;

FIG. 16 is a schematic diagram of a vehicle of a fifth embodiment;

FIG. 17 is a schematic diagram of a vehicle of a sixth embodiment; and

Figure 18:
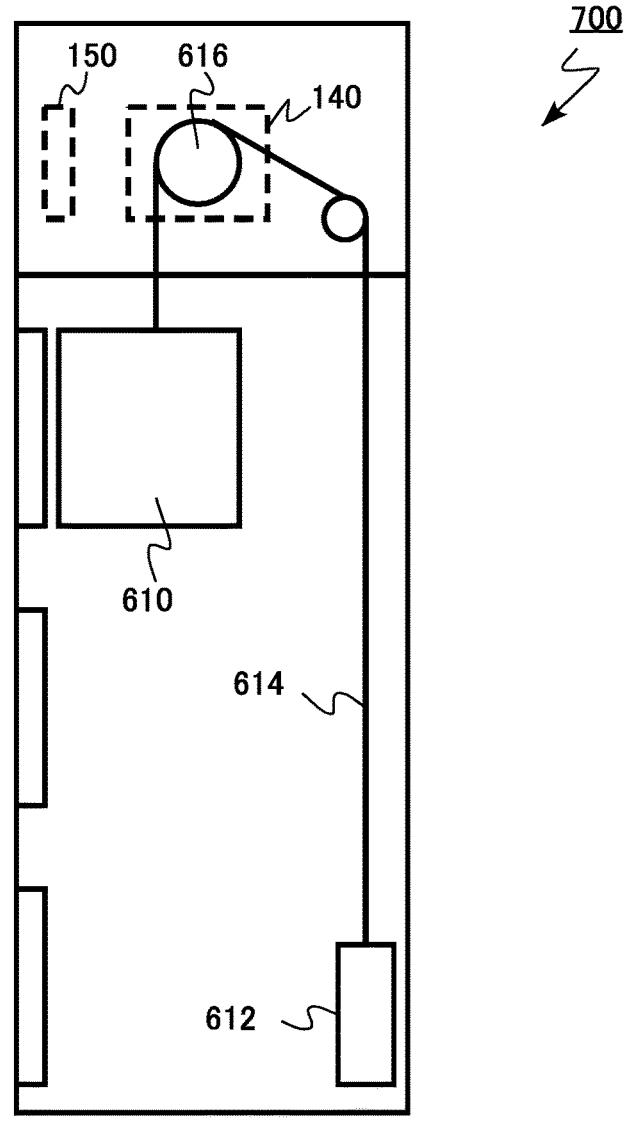

FIG. 18 is a schematic diagram of an elevator of a seventh embodiment.

DETAILED DESCRIPTION

A semiconductor device of an embodiment includes a silicon carbide layer, a gate electrode, a gate insulating layer disposed between the silicon carbide layer and the gate electrode, a first region disposed in the silicon carbide layer and containing nitrogen (N), and a second region disposed between the first region and the gate insulating layer and containing at least one element selected from the group consisting of nitrogen (N), phosphorus (P), arsenic (As), antimony (Sb), scandium (Sc), yttrium (Y), lanthanum (La), lanthanoids (Ce, Pr, Nd, Pm, Sm, Eu, Gd, Tb, Dy, Ho, Er, Tm, Yb, Lu), hydrogen (H), deuterium (D), and fluorine (F).

Embodiments of the present disclosure will be described below by referring to the accompanying drawings. In the following description, the same reference signs are given to the same or similar members, and the description thereof will not be repeated.

Notations, such as $n^+$, $n$, $n^-$, $p^+$, $p$, and $p^-$, indicate relative levels of impurity concentration for each conductivity type. That is, $n^+$ and $n^-$ respectively indicate a relatively higher impurity concentration and a relatively lower impurity concentration of an n-type impurity. In addition, $p^+$ and $p^-$ respectively indicate a relatively higher impurity concentration and a relatively lower impurity concentration of a p-type impurity. Both $n^+$-type and $n^-$-type may simply be referred to as the n-type, and both $p^+$-type and $p^-$-type may simply be referred to as the p-type.

First Embodiment

A semiconductor device of a first embodiment includes a silicon carbide layer, a gate electrode, a gate insulating layer disposed between the silicon carbide layer and the gate electrode, a first region disposed in the silicon carbide layer and containing nitrogen (N), and a second region disposed between the first region and the gate insulating layer and containing at least one element selected from the group consisting of nitrogen (N), phosphorus (P), arsenic (As), antimony (Sb), scandium (Sc), yttrium (Y), lanthanum (La), lanthanoids (Ce, Pr, Nd, Pm, Sm, Eu, Gd, Tb, Dy, Ho, Er, Tm, Yb, Lu), hydrogen (H), deuterium (D), and fluorine (F).

Figure 1:
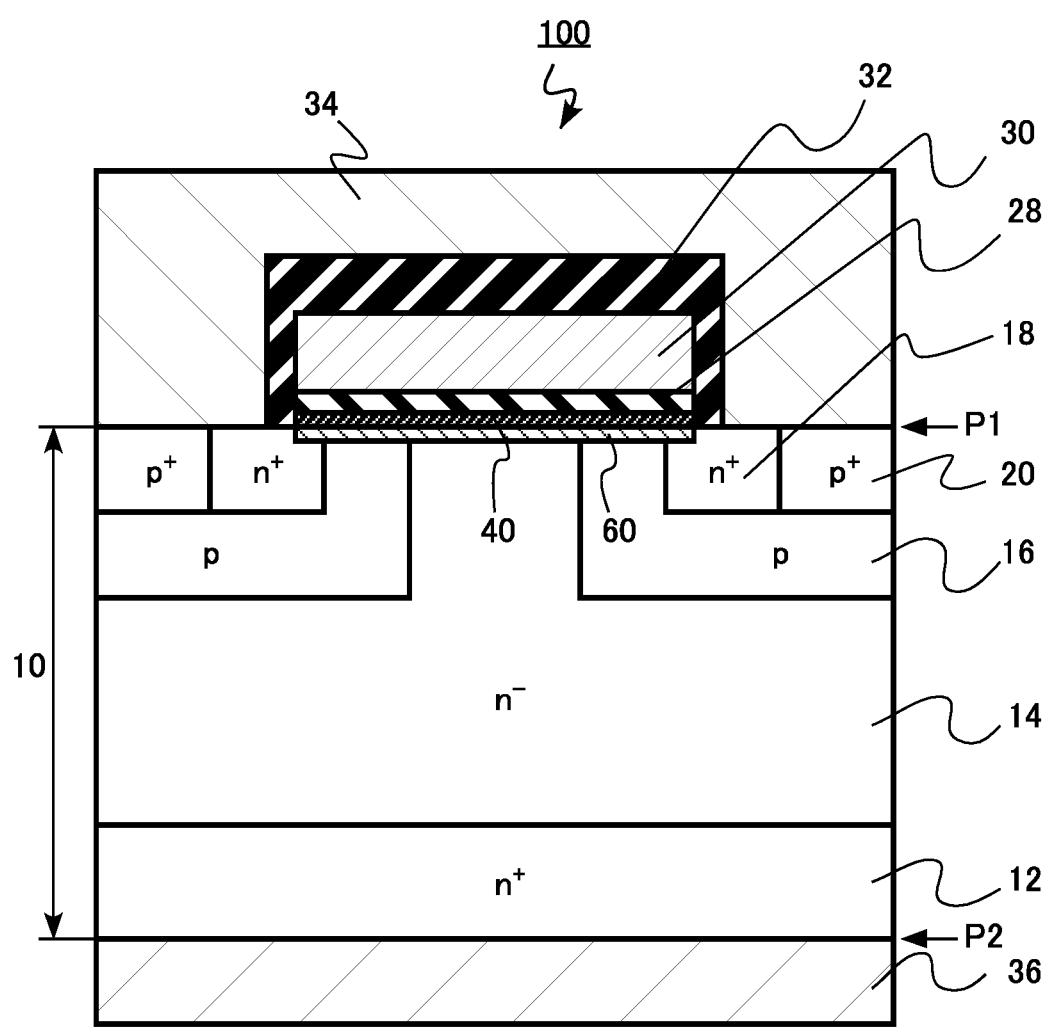
FIG. 1 is a schematic cross-sectional view of a semiconductor device of a first embodiment.

FIG. 1 is a schematic cross-sectional view of a semiconductor device of the first embodiment. The semiconductor device of the first embodiment is a MOSFET 100. The MOSFET 100 is a double implantation MOSFET (DIMOSFET) which forms a p-well and a source region by ion implantation. The MOSFET 100 is an n-type MOSFET that uses electrons as carriers.

The MOSFET 100 includes a silicon carbide layer 10, a drain region 12, a drift region 14, a p-well region 16, a source region 18, a p-well contact region 20, a gate insulating layer 28, a gate electrode 30, an interlayer insulating film 32, a source electrode 34, a drain electrode 36, a nitrogen region 60 (first region), and a termination region 40 (second region). The drain region 12, the drift region 14, the p-well region 16, the source region 18, and the p-well contact region 20 are disposed in the silicon carbide layer 10.

The silicon carbide layer 10 is made of single crystal SiC. The silicon carbide layer 10 is made of, for example, 4H—SiC.

Figure 2:
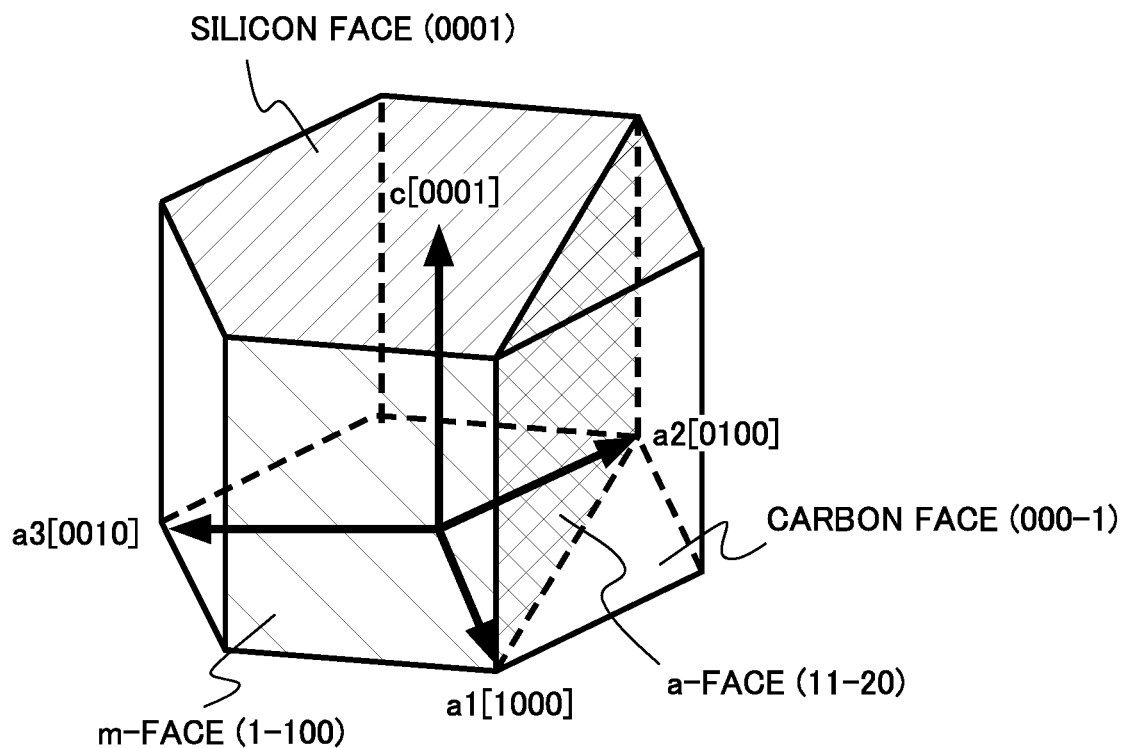
FIG. 2 illustrates a crystal structure of a SiC semiconductor of the first embodiment.

FIG. 2 is a diagram showing a crystal structure of a silicon carbide semiconductor. A typical crystal structure of a silicon carbide semiconductor is a hexagonal crystal system such as 4H—SiC. A (0001) face is one of top faces (i.e., top faces of a hexagonal prism) with its normal being a c-axis extending along an axial direction of the hexagonal prism. A face equivalent to the (0001) face is referred to as a silicon face and represented by a {0001} face. Silicon (Si) is disposed on the silicon face.

A (000-1) face is the other of the top faces (i.e., the top faces of the hexagonal prism) with its normal being the c-axis extending along the axial direction of the hexagonal prism. A face equivalent to the (000-1) face is referred to as a carbon face and represented by a {000-1} face. Carbon (C) is disposed on the carbon face.

Meanwhile, a side face (cylindrical face) of the hexagonal prism is an m-face equivalent to the (1-100) face, that is, the {1-100} face. A face passing a pair of ridgelines that are not adjacent to each other is an a-face equivalent to the (11-20) face, that is, the {11-20} face. Both silicon (Si) and carbon (C) are disposed on the m-face and the a-face.

The silicon carbide layer 10 has a first surface P1 (front surface) and a second surface P2 (rear surface). The front surface P1 of the silicon carbide layer 10 is, for example, a surface inclined at 0 degree to 8 degrees with respect to the (0001) face. The (0001) face is referred to as a silicon face. The rear surface P2 of the silicon carbide layer 10 is, for example, a surface inclined at 0 degree to 8 degrees with respect to the (000-1) face.

The drain region 12 is made of, for example, n$^+$-type SiC. The drain region 12 includes, for example, nitrogen (N) as an n-type impurity. An impurity concentration of the n-type impurity in the drain region 12 is, for example, $1\times10^{18}$ cm$^{-3}$ or more and $1\times10^{20}$ cm$^{-3}$ or less.

The drift region 14 is disposed on the drain region 12. The drift region 14 is made of n$^-$-type SiC. The drift region 14 includes, for example, nitrogen (N) as the n-type impurity.

An impurity concentration of the n-type impurity in the drift region 14 is, for example, $5\times10^{15}$ cm$^{-3}$ or more and $2\times10^{16}$ cm$^{-3}$ or less. The drift region 14 is, for example, an SiC epitaxial growth layer formed by epitaxial growth on the drain region 12. A thickness of the drift region 14 is, for example, from 5 μm to 100 μm.

The p-well region 16 is disposed on a part of the surface of the drift region 14. The p-well region 16 is made of p-type SiC. The p-well region 16 includes, for example, aluminum (Al) as the p-type impurity. An impurity concentration of the p-type impurity in the p-well region 16 is, for example, $5\times10^{15}$ cm$^{-3}$ or more and $1\times10^{17}$ cm$^{-3}$ or less.

A depth of the p-well region 16 is, for example, from 0.4 μm to 0.8 μm. The p-well region 16 functions as a channel region of the MOSFET 100.

The surface of the p-well region 16 is a surface inclined at 0 degree to 8 degrees with respect to the silicon face.

The source region 18 is disposed on a part of the surface of the p-well region 16. The source region 18 is made of n$^+$-type SiC. The source region 18 includes, for example, phosphorous (P) as the n-type impurity. An impurity concentration of the n-type impurity in the source region 18 is, for example, $1\times10^{18}$ cm$^{-3}$ or more and $1\times10^{22}$ cm$^{-3}$ or less.

The depth of the source region 18 is shallower than the depth of the p-well region 16. The depth of the source region 18 is, for example, 0.2 μm to 0.4 μm.

The well contact region 20 is disposed on a part of the surface of the p-well region 16. The well contact region 20 is disposed on the side of the source region 18. The well contact region 20 is made of p$^+$-type SiC.

The well contact region 20 includes, for example, aluminum (Al) as the p-type impurity. An impurity concentration of the p-type impurity in the well contact region 20 is, for example, $1\times10^{18}$ cm$^{-3}$ or more and $1\times10^{22}$ cm$^{-3}$ or less.

The depth of the p-well contact region 20 is shallower than the depth of the p-well region 16. The depth of the p-well contact region 20 is, for example, from 0.2 μm to 0.4 μm.

The gate insulating layer 28 is disposed between the p-well region 16 and the gate electrode 30 and between the drift region 14 and the gate electrode 30. The gate insulating layer 28 is, for example, made of silicon oxide. To the gate insulating layer 28, silicon oxynitride or a high-k material, for example, can be applied.

The thickness of the gate insulating layer 28 is, for example, 20 nm to 150 nm. The gate insulating layer 28 functions as a gate insulating layer of the MOSFET 100.

The gate electrode 30 is disposed on the gate insulating layer 28. A gate insulating layer 28 is disposed between the gate electrode 30 and the termination region 40.

To the gate electrode 30, polycrystalline silicon containing an n-type impurity or a p-type impurity, for example, can be applied.

The interlayer insulating film 32 is formed on the gate electrode 30. The interlayer insulating film 32 is made of, for example, a silicon oxide film.

The source electrode 34 is electrically connected to the source region 18 and the p-well contact region 20. The source electrode 34 also functions as a p-well electrode for applying a potential to the p-well region 16. The source electrode 34 is in contact with the silicon carbide layer 10.

The source electrode 34 is made of, for example, laminated layers of a barrier metal layer of nickel (Ni) and a metal layer of aluminum on the barrier metal layer. The nickel barrier metal layer and the silicon carbide layer 10 may react to form nickel silicide (NiSi, Ni$_2$Si, etc.). The barrier metal layer of nickel and the metal layer of aluminum may react to form an alloy.

The drain electrode 36 is electrically connected to the drain region 12. The drain electrode 36 is disposed on the rear surface P2 side of the silicon carbide layer 10. The drain electrode 36 is in contact with the silicon carbide layer 10.

The drain electrode 36 is, for example, nickel. Nickel may react with the silicon carbide layer 10 to form nickel silicide (NiSi, Ni$_2$, Si, etc.).

The nitrogen region 60 is disposed in the silicon carbide layer 10. The nitrogen region 60 is disposed adjacent to the front surface P1 of the silicon carbide layer 10. The nitrogen region 60 is in contact with the front surface P1 of the silicon carbide layer 10. The nitrogen region 60 is disposed adjacent to the gate insulating layer 28.

The nitrogen region 60 is disposed in the p-well region 16. The nitrogen region 60 in the p-well region 16 is p-type silicon carbide.

The nitrogen region 60 contains nitrogen (N). The nitrogen region 60 is silicon carbide containing nitrogen (N). The nitrogen region 60 functions as a channel region of the MOSFET 100.

Figure 3:
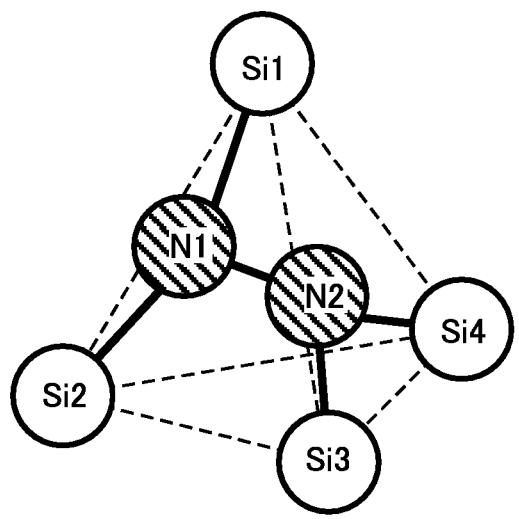
FIG. 3 illustrates explanatory views for explaining a nitrogen region of the semiconductor device of the first embodiment.

FIG. 3 illustrates explanatory views for explaining the nitrogen region of the semiconductor device of the first embodiment. The nitrogen region 60 has a structure in which two nitrogen atoms are present at the carbon position of the silicon carbide crystal lattice, as illustrated in FIG. 3. In other words, the nitrogen region 60 has a structure in which two nitrogen atoms are contained in the carbon vacancy Vc of the silicon carbide crystal lattice. Hereinafter, this structure is referred to as a VcNN structure.

As illustrated in FIG. 3, the VcNN structure includes a first nitrogen atom N1 bonded to two silicon atoms Si1 and Si2, and a second nitrogen atom N2 bonded to the first nitrogen atom N1 and also bonded to two silicon atoms Si3 and Si4.

Since the nitrogen region 60 has the VcNN structure, the density of the carbon vacancies Vc of the silicon carbide layer 10 is reduced.

The termination region 40 is disposed between the nitrogen region 60 and the gate insulating layer 28. The termination region 40 is disposed in the vicinity of the interface between the silicon carbide layer 10 and the gate insulating layer 28.

The termination region 40 contains at least one termination element selected from the group consisting of nitrogen (N), phosphorus (P), arsenic (As), antimony (Sb), scandium (Sc), yttrium (Y), lanthanum (La), lanthanoids (Ce, Pr, Nd, Pm, Sm, Eu, Gd, Tb, Dy, Ho, Er, Tm, Yb, Lu), hydrogen (H), deuterium (D), and fluorine (F).

In the termination region 40, the termination element terminates dangling bonds at the interface between the silicon carbide layer 10 and the gate insulating layer 28 by substituting carbon atoms or silicon atoms on the surface of the silicon carbide layer 10. Alternatively, dangling bonds are terminated by directly bonding to dangling bonds.

Figure 4:
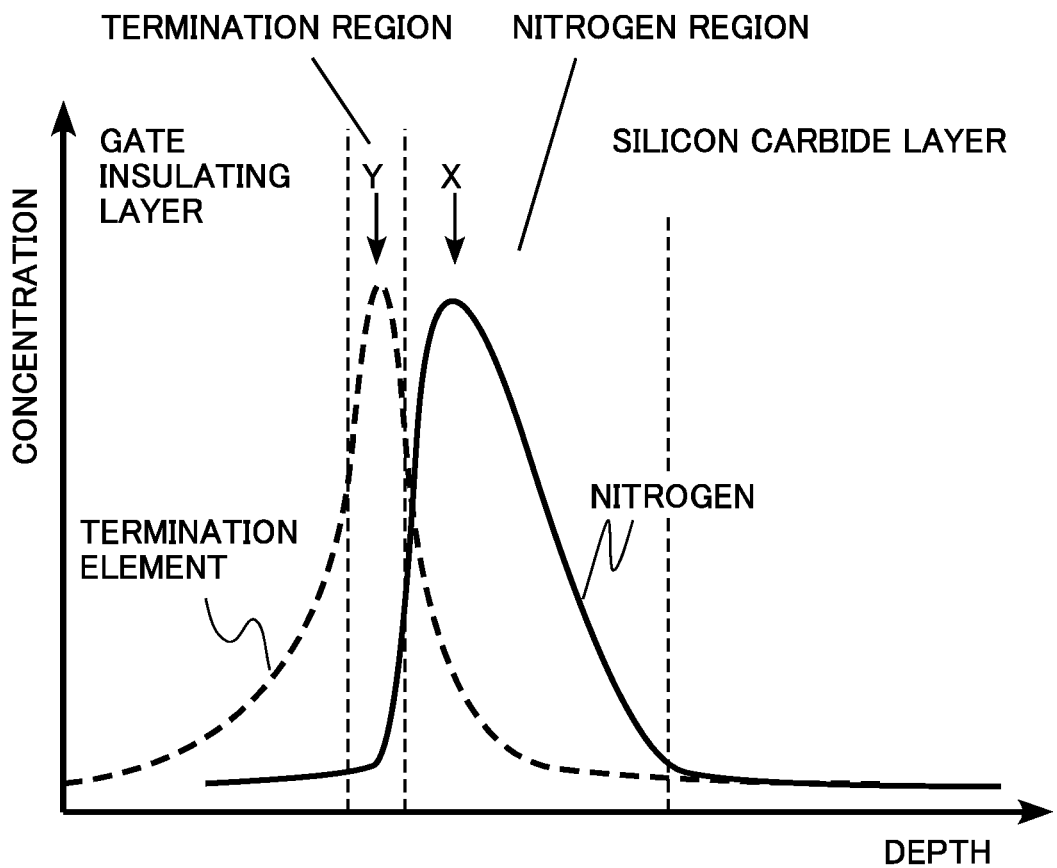
FIG. 4 is a graph illustrating the concentration distribution of elements in the semiconductor device of the first embodiment.

FIG. 4 is a graph illustrating the concentration distribution of elements in the semiconductor device of the first embodiment. FIG. 4 illustrates the concentration distribution of nitrogen and termination elements in the cross-section including the silicon carbide layer 10 and the gate insulating layer 28. FIG. 4 illustrates a cross-section including the p-well region 16 of the silicon carbide layer 10.

As illustrated in FIG. 4, the concentration distribution of nitrogen in the nitrogen region 60 has a peak X. The peak concentration of nitrogen in the nitrogen region 60 is, for example, $1\times10^{17}$ cm$^{-3}$ or more and $1\times10^{22}$ cm$^{-3}$ or less. A full width at half maximum of the concentration distribution of nitrogen in the nitrogen region 60 is, for example, 1.5 nm or more and 5 nm or less.

As illustrated in FIG. 4, the concentration distribution of the termination element in the termination region 40 has a peak Y. The termination element segregates at the interface between the p-well region 16 and the gate insulating layer 28.

The peak concentration of the termination element of the termination region 40 is, for example, $1\times10^{18}$ cm$^{-3}$ or more and $1\times10^{23}$ cm$^{-3}$ or less. The full width at half maximum of the concentration distribution of the termination element in the termination region 40 is, for example, 0.25 nm or more and 2 nm or less.

The distance between the peak position of the nitrogen concentration distribution of the nitrogen region 60 and the peak position of the concentration distribution of the termination element of the termination region 40 is 10 nm or less. In other words, the distance between the peak X and the peak Y is 10 nm or less.

The nitrogen region 60 exists on the p-well region 16 side of the termination region 40.

In the first embodiment, nitrogen (N) or phosphorus (P) is preferably used as the n-type impurity, but arsenic (As), antimony (Sb), or the like may also be used. Aluminum (Al) is preferably used as the p-type impurity, but boron (B), gallium (Ga), indium (In), or the like may also be used.

The bonding state of nitrogen in the nitrogen region 60 and the position of nitrogen in the silicon carbide crystal lattice can be determined by, for example, X-ray photoelectron spectroscopy (XPS). The distributions of the nitrogen in the nitrogen region 60 and the termination element in the termination region 40 can be measured by, for example, secondary ion mass spectrometry (SIMS). Whether the nitrogen region 60 is p-type or not can be determined by, for example, scanning capacitance microscopy (SCM).

Next, a method for manufacturing the semiconductor device of the first embodiment is described.

A method for manufacturing a semiconductor device of the first embodiment includes forming a first region including nitrogen by performing heat treatment on a silicon carbide layer having an exposed surface at a temperature of 1300° C. or more and 1400° C. or less in an $N_2$ gas having an oxygen partial pressure of 0.1 ppm or less; forming a gate insulating layer on the silicon carbide layer after the forming the first region; and forming a gate electrode on the gate insulating layer. Before the heat treatment, the surface is also subjected to hydrogen plasma treatment or electron beam irradiation. In addition, a second region containing at least one element selected from the group consisting of nitrogen (N), phosphorus (P), arsenic (As), antimony (Sb), scandium (Sc), yttrium (Y), lanthanum (La), lanthanoids (Ce, Pr, Nd, Pm, Sm, Eu, Gd, Tb, Dy, Ho, Er, Tm, Yb, Lu), hydrogen (H), deuterium (D), and fluorine (F) between the gate insulating layer and the second region. Hereinafter, a case where the termination element is nitrogen (N) is described as an example.

FIGS. 5 to 8 are schematic cross-sectional views illustrating a semiconductor device during the manufacturing process in a method for manufacturing the semiconductor device of the first embodiment.

First, an n$^+$-type silicon carbide substrate having a first surface which is a silicon face and a second surface which is a carbon face. The silicon carbide substrate corresponds to the drain region 12 of the silicon carbide layer 10. Next, the n$^-$-type drift region 14 is formed on the silicon carbide substrate by epitaxial growth.

Figure 5:
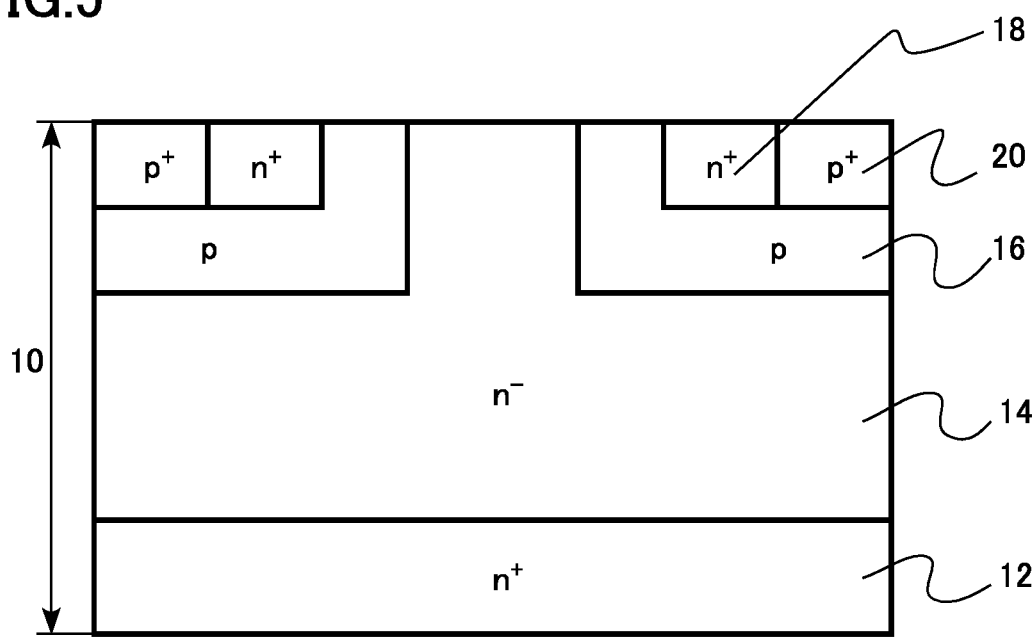
FIG. 5 is a schematic cross-sectional view of the semiconductor device during the manufacturing process of a method for manufacturing the semiconductor device of the first embodiment.

Next, the p-type p-well region 16, the n$^+$-type source region 18, and the p$^+$-type p-well contact region 20 are formed by photolithography and ion implantation which are known in the art (FIG. 5).

Next, hydrogen plasma treatment or electron beam irradiation treatment is performed on the surface of the silicon carbide layer 10. By the hydrogen plasma treatment or the electron beam irradiation treatment, a large amount of carbon vacancies Vc are formed in the vicinity of the surface of the silicon carbide layer 10.

For example, in the case of hydrogen plasma treatment, carbon in the silicon carbide crystal lattice becomes methane ($CH_4$) and is desorbed from the silicon carbide layer 10 to form a carbon vacancy Vc. Further, for example, in the case of electron beam irradiation treatment, bonds of the silicon carbide crystal lattice are cut off by the energy of the electron beam, whereby the carbon vacancy Vc is formed.

Figure 6:
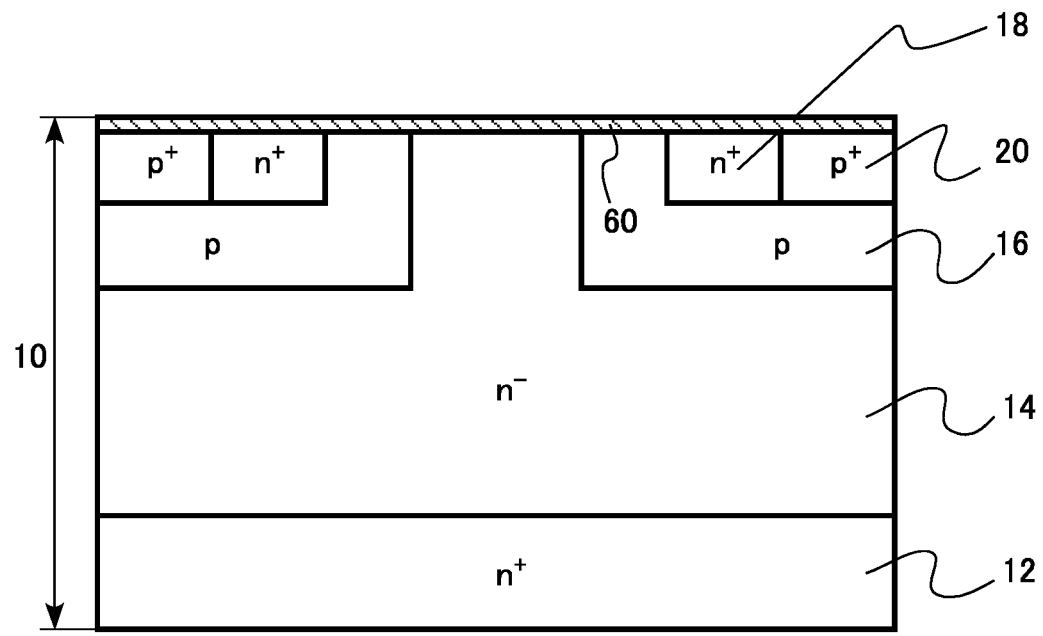
FIG. 6 is a schematic cross-sectional view of the semiconductor device during the manufacturing process of the method for manufacturing the semiconductor device of the first embodiment.

Next, heat treatment is performed on the silicon carbide layer 10 having the exposed surface at a temperature of 1300° C. or more and 1400° C. or less in the $N_2$ gas having an oxygen partial pressure of 0.1 ppm or less. By this heat treatment, the nitrogen region 60 is formed (FIG. 6). In the nitrogen region 60, the carbon vacancy Vc is filled with two nitrogen atoms to form the VcNN structure.

Figure 7:
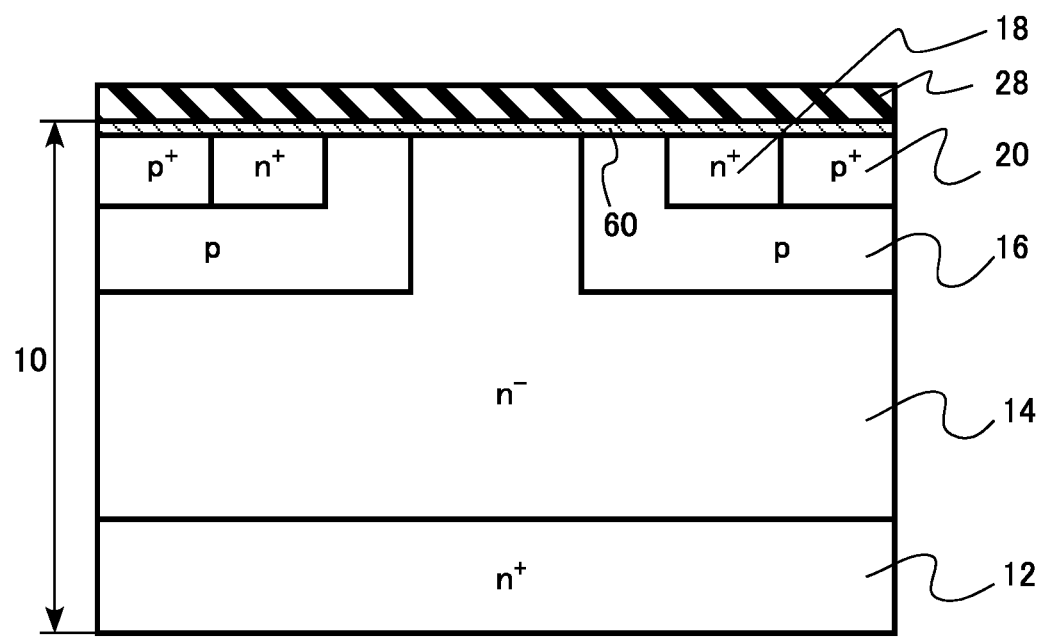
FIG. 7 is a schematic cross-sectional view of the semiconductor device during the manufacturing process of the method for manufacturing the semiconductor device of the first embodiment.

Next, a gate insulating layer 28 is formed on the silicon carbide layer 10 (FIG. 7). The gate insulating layer 28 is, for example, a silicon oxide film formed by chemical vapor deposition (CVD) method.

Figure 8:
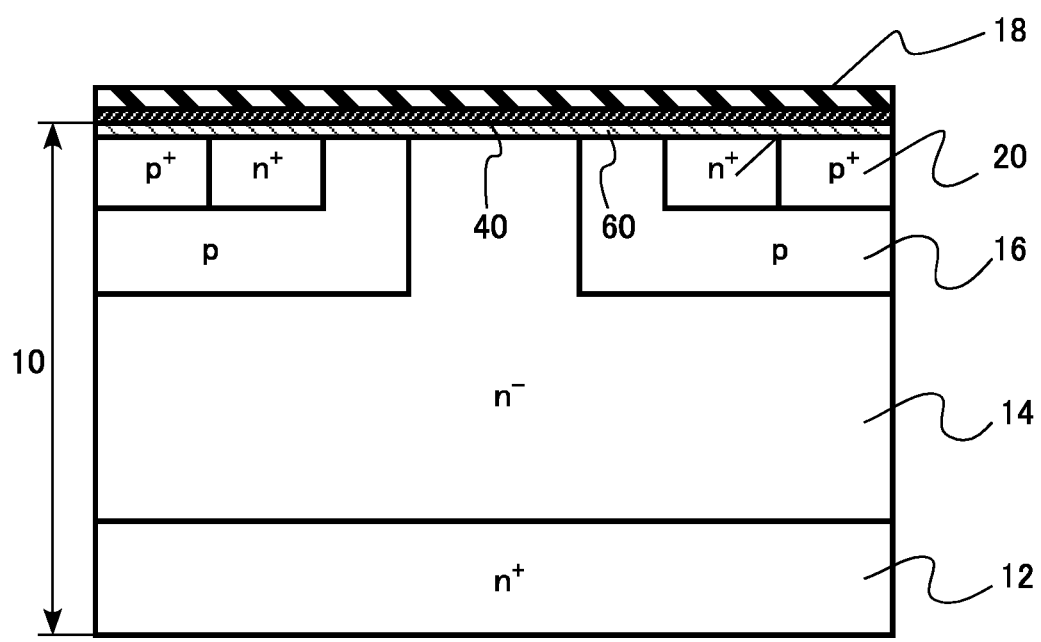
FIG. 8 is a schematic cross-sectional view of the semiconductor device during the manufacturing process of the method for manufacturing the semiconductor device of the first embodiment.

Next, the termination region 40 containing nitrogen (N) is formed between the gate insulating layer 28 and the nitrogen region 60 (FIG. 8). For example, the surface of the nitrogen region 60 is nitrided in a NO atmosphere, for example, at a temperature of 1250° C. or more and 1300° C. or less to form the termination region 40. It is also possible to perform the nitriding treatment in an $N_2O$ atmosphere or an $NH_3$ atmosphere.

The formation of VcNN in the nitrogen region 60 improves the oxidation resistance. Therefore, the NO treatment can be performed at a higher temperature than usual. Formation of the termination region 40 by interfacial nitrogen termination improves the interface termination efficiency as the temperature increases. On the other hand, there is a trade-off in that, when the oxidation develops to the inside of the substrate, the termination efficiency decreases. Since the processing temperature for forming the termination region 40 can be raised, the termination efficiency improves.

Next, the gate electrode 30 is formed on the gate insulating layer 28 by a known method. The gate electrode 30 is made of, for example, doped polysilicon formed by LPCVD method.

Then, the interlayer insulating film 32, the source electrode 34, and the drain electrode 36 are formed by a known process, and the MOSFET 100 of the first embodiment shown in FIG. 1 is manufactured.

In a case where the termination element of the termination region 40 is one of phosphorus (P), arsenic (As), antimony (Sb), scandium (Sc), yttrium (Y), lanthanum (La), and lanthanoids (Ce, Pr, Nd, Pm, Sm, Eu, Gd, Tb, Dy, Ho, Er, Tm, Yb, Lu), an oxide film having a thickness of about 50 nm is deposited before the formation of the gate insulating layer 28, and ion implantation of ions of the termination element into the interior of the oxide film is performed. Then, a termination element is introduced into the interface between the silicon carbide layer 10 and the oxide film by thermal diffusion to form the termination region 40. After that, the deposited oxide film is removed by etching.

Further, in a case where the termination element is, for example, hydrogen (H), deuterium (D), or fluorine (F), heat treatment is performed in an atmosphere containing H, D, or F, for example, after the gate insulating layer 28 is formed, whereby the termination region 40 is formed.

In the following, functions and effects of the semiconductor device and the method of manufacturing the semiconductor device of the first embodiment will be described.

When a MOSFET is formed using silicon carbide, carrier mobility is low. One reason for the low carrier mobility may be the presence of carbon vacancies Vc in the vicinity of the surface of the silicon carbide layer 10. Further, another reason for the low carrier mobility may be the dangling bond existing at the interface between the silicon carbide layer 10 and the gate insulating layer 28.

The MOSFET 100 of the first embodiment includes the nitrogen region 60. The nitrogen region 60 has the VcNN structure, so that the density of the carbon vacancies Vc of the silicon carbide layer 10 can be reduced. The MOSFET 100 also includes the termination region 40. Dangling bonds are terminated by the termination region 40. Therefore, the carrier mobility of the MOSFET 100 improves. Details will be described below.

Figure 9A:
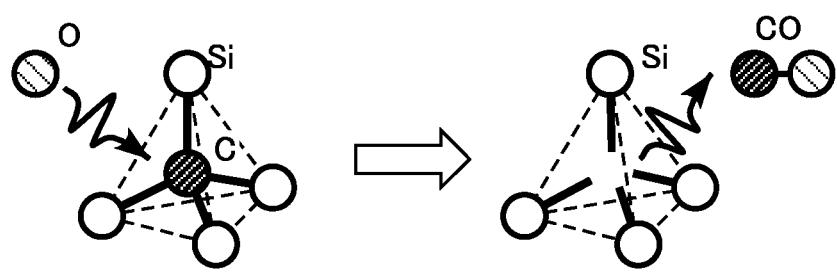
FIGS. 9A, 9B, and 9C are explanatory views for explaining the function of the semiconductor device and the method of manufacturing the semiconductor device of the first embodiment.
Figure 9B:
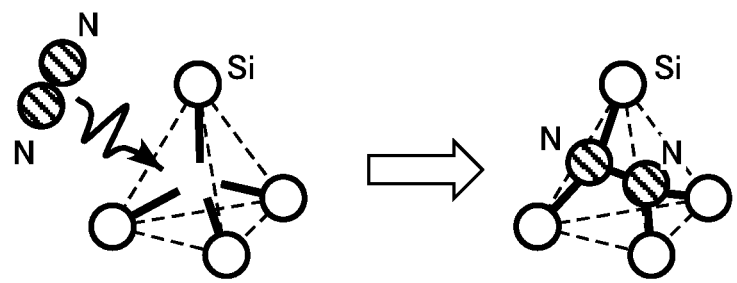
Figure 9C:
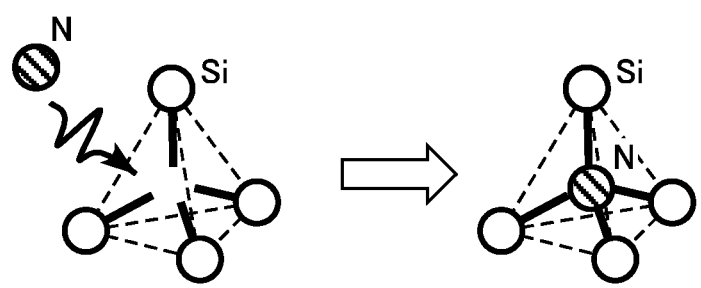

FIGS. 9A, 9B, and 9C are explanatory views of the function of the semiconductor device and the method of manufacturing the semiconductor device of the first embodiment. FIG. 9A is an explanatory view of the carbon vacancy Vc, FIG. 9B is an explanatory view of the VcNN structure, and FIG. 9C is an explanatory view of a VcN structure. The VcN structure is a structure in which one nitrogen atom is contained in the carbon vacancy Vc of the silicon carbide crystal lattice.

For example, it is assumed that oxygen (O) is supplied into the silicon carbide layer 10 from the surface of the silicon carbide layer 10 during oxidation. In this case, carbon (C) in the silicon carbide crystal lattice is bonded with oxygen to generate carbon monoxide (CO). As a result, the carbon vacancy Vc is formed (FIG. 9A). The carbon vacancy Vc is formed not only by supplying oxygen, but also by ion implantation of impurities.

As a result of the first principle calculation, it became clear that the VcNN structure containing two nitrogen atoms can exist stably in the carbon vacancy Vc. In order to form the VcNN structure, it is apparently desirable to supply $N_2$ molecules to the silicon carbide layer 10 where the carbon vacancies Vc are present in the excited state of $N_2$ molecules (FIG. 9B). That is, it is apparent that the VcNN structure can be formed when a pair of nitrogen atoms is excited and coexists with the carbon vacancy Vc. Specifically, the VcNN structure is formed by performing heat treatment in a high-temperature $N_2$ gas atmosphere.

For example, in nitrogen plasma treatment, nitrogen is excited as one atom, so that the VcN structure is formed instead of the VcNN structure (FIG. 9C).

Figure 10:
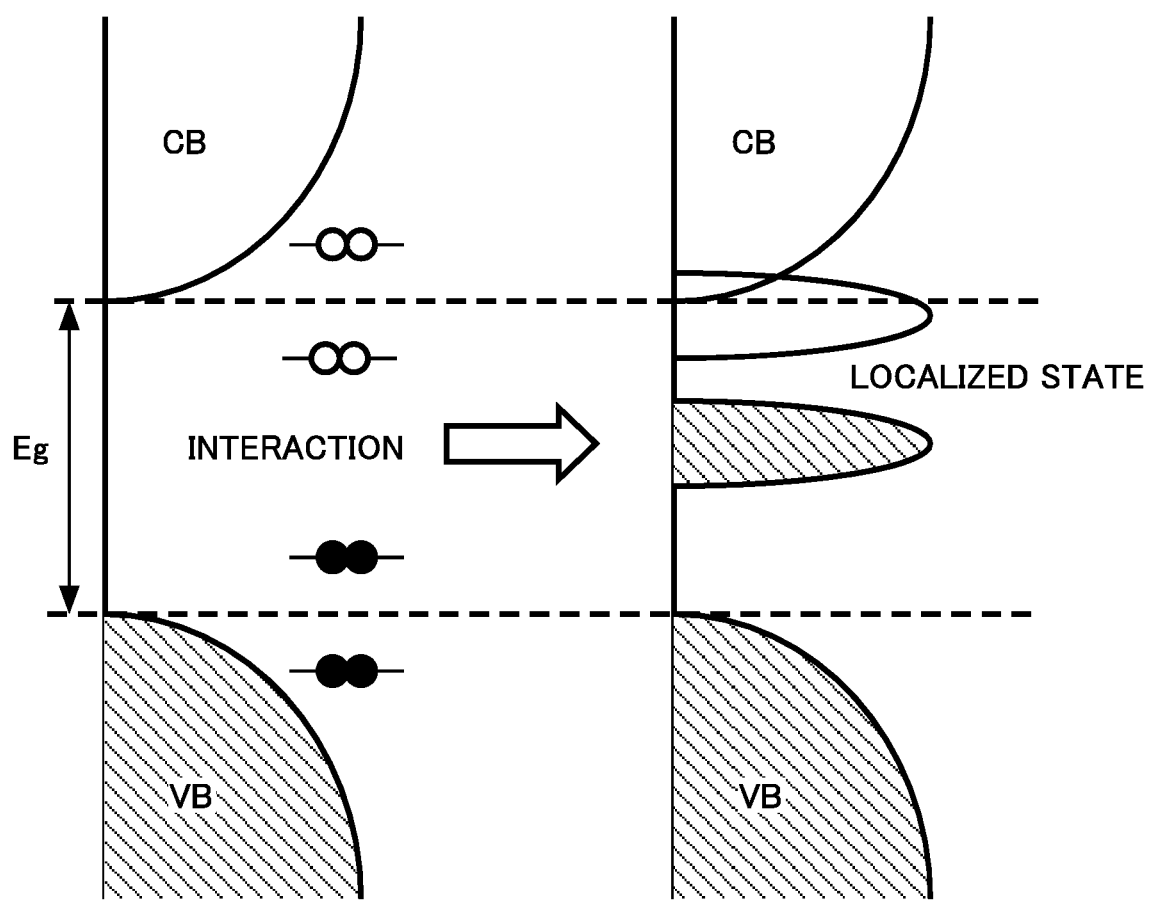
FIG. 10 is an explanatory diagram for explaining the function of the semiconductor device and the method for manufacturing the semiconductor device of the first embodiment.

FIG. 10 is an explanatory diagram of the function of the semiconductor device and the method for manufacturing the semiconductor device of the first embodiment. FIG. 10 is an explanatory diagram for explaining the electronic state of the carbon vacancy Vc. FIG. 10 illustrates a band of silicon carbide when carbon vacancies Vc exist.

Four silicon dangling bonds are formed by the carbon vacancies Vc, with each silicon dangling bond forming an energy level, as illustrated on the left side of FIG. 10. The black circles indicate a state in which the energy level is filled with electrons, and the open circles indicate a state in which the energy level is not filled with electrons. As the energy levels interact with each other, localized states are formed in the middle of the band gap and the lower end of the conduction band CB, as illustrated on the right side of the drawing. In particular, the localized state at the lower end of the conduction band CB acts as a trap of electrons and lowers the mobility of electrons.

Figure 11A:
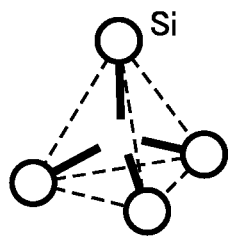
Figure 11A:
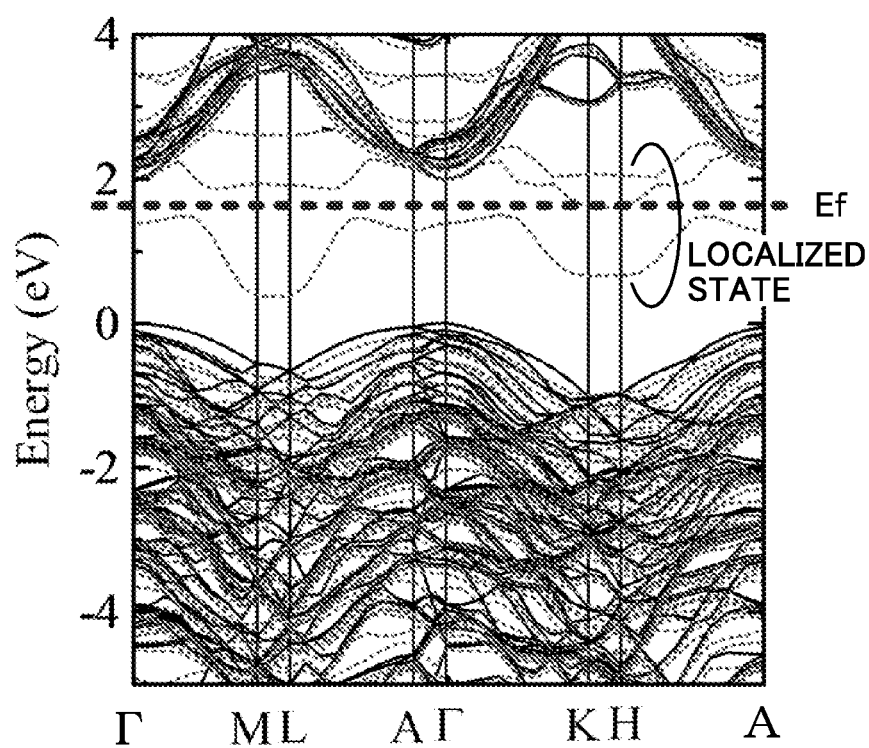
Figure 11B:
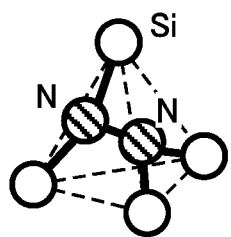
Figure 11B:
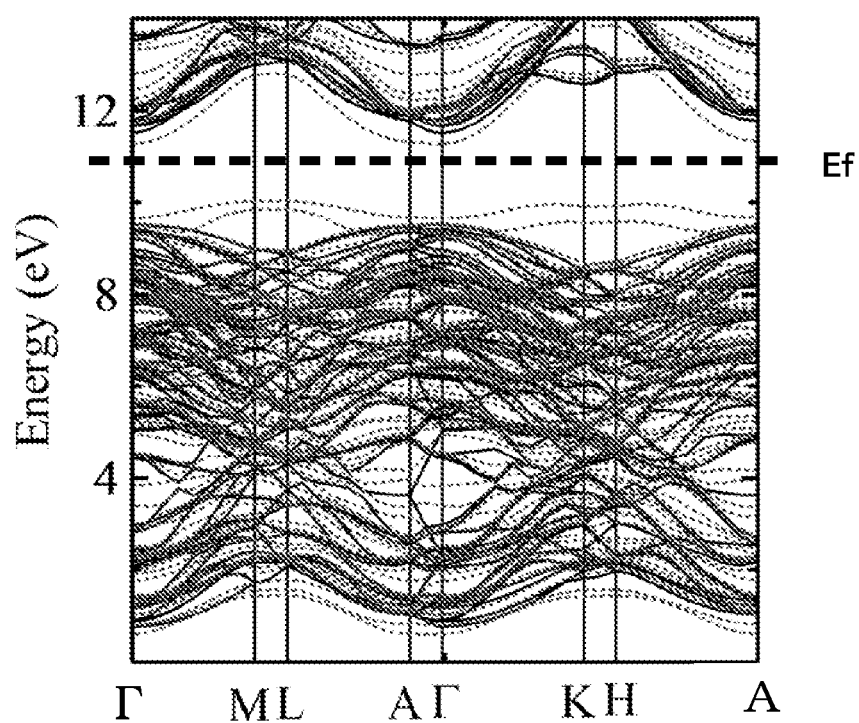

FIGS. 11A and 11B are explanatory diagrams for explaining the function of the semiconductor device and the method for manufacturing the semiconductor device of the first embodiment. FIG. 11A is a band diagram in a case where carbon vacancies Vc are present in the silicon carbide crystal lattice, and FIG. 11B is a band diagram in a case where the VcNN structure exists in the silicon carbide crystal lattice. FIGS. 11A and 11B are simulation results.

As illustrated in FIG. 11A, in the presence of the carbon vacancies Vc, localized states are formed in the middle of the band gap and the lower end of the conduction band CB. On the other hand, as illustrated in FIG. 11B, when the VcNN structure exists, the localized state disappears.

By forming the VcNN structure, the carbon vacancies Vc disappear and the localized state in the band gap disappears. Therefore, carrier trapping is prevented. This increases the mobility of carriers, so that the MOSFET 100 having a low on-resistance is fabricated.

If the VcN structure illustrated in FIG. 9C is formed instead of the VcNN structure, the VcN structure functions as a donor. This increases the n-type concentration in the channel region. Accordingly, the threshold voltage of the MOSFET decreases.

Furthermore, it is apparent that, when the VcNN structure is formed, the lower end of the conduction band CB and the upper end of the valence band VB protrude into the band gap. In other words, the unevenness of the lower end of the conduction band CB and the upper end of the valence band VB became clear.

When the unevenness of the lower end of the conduction band CB and the upper end of the valence band VB increases, the effective mass of the carrier is reduced. As the effective mass of the carrier is reduced, the mobility of carriers increases. From the above, the MOSFET 100 having a low on-resistance can also be fabricated.

In the MOSFET 100, the termination region 40 terminates the dangling bond at the interface between the silicon carbide layer 10 and the gate insulating layer 28. This prevents trapping and scattering of carriers due to the dangling bond at the interface. This increases the mobility of carriers, so that the MOSFET 100 having a low on-resistance is fabricated.

The peak nitrogen concentration in the nitrogen region 60 is preferably $1 \times 10^{17}$ cm$^{-3}$ or more and $1 \times 10^{22}$ cm$^{-3}$ or less, more preferably $1 \times 10^{18}$ cm$^{-3}$ or more, and more preferably $1 \times 10^{19}$ cm$^{-3}$ or more. If the peak concentration is lower than the above range, sufficient improvement of carrier mobility may not be achieved. In addition, exceeding the above range is difficult in manufacturing.

The full width at half maximum of the nitrogen concentration distribution in the nitrogen region 60 is preferably 1.5 nm or more and 5 nm or less. If the peak concentration is lower than the above range, sufficient improvement of carrier mobility may not be achieved. In addition, exceeding the above range is difficult in manufacturing.

The peak concentration of the termination element of the termination region 40 is preferably $1 \times 10^{18}$ cm$^{-3}$ or more and $1 \times 10^{23}$ cm$^{-3}$ or less. If the peak concentration is lower than the above range, sufficient improvement of carrier mobility may not be achieved. In addition, exceeding the above range is difficult in manufacturing.

In the method for manufacturing the first embodiment, the VcNN structure is formed in the nitrogen region 60 before the termination region 40 is formed, so that the carbon vacancies Vc disappear. Therefore, even when an atmosphere containing oxygen such as NO or $N_2O$ is used for forming the termination region 40, oxidation of the silicon carbide layer 10 hardly develops and new carbon vacancies Vc are hardly generated. Accordingly, it is difficult to form the VcN structure, thus preventing the decrease of a threshold voltage of the MOSFET 100.

In the method for manufacturing the first embodiment, hydrogen plasma treatment or electron beam irradiation treatment is preferably performed on the surface of the silicon carbide layer 10 before the nitrogen region 60 is formed. By the hydrogen plasma treatment or the electron beam irradiation treatment, a large amount of carbon vacancies Vc are formed in the vicinity of the surface of the silicon carbide layer 10.

By forming a large amount of carbon vacancies Vc on purpose before forming the nitrogen region 60, the amount of the VcNN structure in the nitrogen region 60 can be increased. As the amount of the VcNN structure increases, the unevenness of the lower end of the conduction band CB and the upper end of the valence band VB further increase. This further decreases the effective mass of the carrier. Accordingly, the carrier mobility further increases.

In the method for manufacturing the first embodiment, an oxygen partial pressure of the heat treatment for forming the nitrogen region 60 is preferably at the lowest possible pressure. If oxygen is present during the heat treatment, oxidation of the surface of the silicon carbide layer 10 develops, probably causing insufficient formation of the VcNN structure. The oxygen partial pressure is 0.1 ppm or less, and preferably 0.01 ppm or less. When the oxidation develops and the oxide film or oxynitride film are formed, a high barrier is created for $N_2$ molecules for intrusion into the oxide film or the oxynitride film. Even when the intrusion of $N_2$ molecules has succeeded, it is not possible to supply $N_2$ molecules to Vc, because $N_2$ molecules are easily decomposed into atoms due to defects in the oxide film or oxynitride film or by receiving charges from the interface dangling bonds. In other words, it is important to prevent formation of the oxide film or oxynitride film, and the prevention can be achieved by reducing the oxygen partial pressure.

In the method for manufacturing the first embodiment, intrusion of the excited $N_2$ molecules into the silicon carbide layer 10 is promoted by performing high-temperature annealing in the $N_2$ gas in a state in which the surface P1 of the silicon carbide layer 10 is exposed. Therefore, the carbon vacancy Vc in the silicon carbide layer 10 can be changed to the VcNN structure.

In the method for manufacturing the first embodiment, the total pressure during the heat treatment is preferably higher than the atmospheric pressure in terms of increasing the amount of the VcNN structure of the nitrogen region 60. By making the total pressure be higher than the atmospheric pressure, intrusion of the excited $N_2$ molecules into the silicon carbide layer 10 is promoted.

As described above, according to the first embodiment, the MOSFET 100 having a high carrier mobility and a low on-resistance is fabricated, and the method for manufacturing such a MOSFET 100 is achieved.

MODIFICATION

FIG. 12 is a schematic cross-sectional view of a modification of the semiconductor device of the first embodiment. A MOSFET of the modification is different from the MOSFET 100 of the first embodiment in not including the termination region 40. The modification includes the nitrogen region 60 to fabricate the MOSFET having a high carrier mobility and a low on-resistance.

Second Embodiment

A semiconductor device of a second embodiment is similar to the first embodiment except the fact that the semiconductor device is a trench gate type MOSFET. In the following, what are similar to those of the first embodiment is partly not repeatedly described.

FIG. 13 is a schematic cross-sectional view of a semiconductor device of the second embodiment. The semiconductor device of the second embodiment is a MOSFET 200. The MOSFET 200 is a trench gate type MOSFET in which the gate insulating layer and the gate electrode are disposed in a trench.

The MOSFET 200 includes the silicon carbide layer 10, the drain region 12, the drift region 14, the p-well region 16, the source region 18, the p-well contact region 20, the gate insulating layer 28, the gate electrode 30, the interlayer insulating film 32, the source electrode 34, the drain electrode 36, a trench 50, the nitrogen region 60 (first region), and the termination region 40 (second region).

The trench 50 is disposed in a direction from the front surface P1 toward the rear surface P2 of the silicon carbide layer 10. The inner wall surface of the trench 50 is, for example, an m-face or an a-face.

The gate insulating layer 28 is disposed between the silicon carbide layer 10 and the gate electrode 30. The gate insulating layer 28 is continuously formed on the surfaces of the drift region 14, the p-well region 16, and the source region 18 in the trench 50.

The gate electrode 30 is disposed in the trench 50. The gate electrode 30 is disposed on the gate insulating layer 28. The p-well region 16 disposed between the source region 18 and the drift region 14 on the side surface of the trench 50 functions as the channel region of the MOSFET 200.

The nitrogen region 60 is disposed in the silicon carbide layer 10. The nitrogen region 60 is disposed along the side and bottom surfaces of trench 50.

The termination region 40 is disposed between the nitrogen region 60 and the gate insulating layer 28. The termination region 40 is disposed in the vicinity of the interface between the silicon carbide layer 10 and the gate insulating layer 28.

In the second embodiment, the presence of the nitrogen region 60 and the termination region 40 allows the same functions and effects as those of the first embodiment to be obtained. Furthermore, by adopting the trench gate structure, the degree of integration of the MOSFET is improved and the JFET region is eliminated, so that the on-resistance can be further reduced.

Third Embodiment

A semiconductor device of a third embodiment is the same as the first embodiment except the fact that not a MOSFET but an insulated gate bipolar transistor (IGBT) is disposed. In the following, what are similar to those of the first embodiment is partly not repeatedly described.

FIG. 14 is a schematic cross-sectional view of a semiconductor device of the third embodiment. The semiconductor device of the third embodiment is an IGBT 300.

The IGBT 300 includes the silicon carbide layer 10, a collector region 112, the drift region 14, the p-well region 16, an emitter region 118, the p-well contact region 20, the gate insulating layer 28, the gate electrode 30, the interlayer insulating film 32, an emitter electrode 134, a collector electrode 136, the nitrogen region 60 (first region), and the termination region 40 (second region).

The collector region 112 is made of, for example, p$^+$-type SiC. The collector region 112 includes, for example, aluminum (Al) as the p-type impurity. An impurity concentration of the p-type impurity of the collector region 112 is, for example, $1 \times 10^{18}$ cm$^{-3}$ or more and $1 \times 10^{20}$ cm$^{-3}$ or less.

The drift region 14 is disposed on the collector region 112. The p-well region 16 is disposed on a part of the surface of the drift region 14. The p-well region 16 is made of p-type SiC. The p-well region 16 functions as a channel region of the IGBT 300.

The emitter region 118 is disposed on a part of the surface of the p-well region 16. The emitter region 118 is made of n$^+$-type SiC. The emitter region 118 includes phosphorus (P) as the n-type impurity. The impurity concentration of the n-type impurity in the emitter region 118 is, for example, $1 \times 10^{18}$ cm$^{-3}$ or more and $1 \times 10^{22}$ cm$^{-3}$ or less.

The depth of the emitter region 118 is shallower than the depth of the p-well region 16. The depth of the emitter region 118 is, for example, from 0.2 μm to 0.4 μm.

The well contact region 20 is disposed on a part of the surface of the p-well region 16. The well contact region 20 is disposed on the side of the emitter region 118. The well contact region 20 is made of p$^+$-type SiC.

The gate insulating layer 28 is disposed between the p-well region 16 and the gate electrode 30 and between the drift region 14 and the gate electrode 30. The gate insulating layer 28 functions as a gate insulating layer of the IGBT 300.

The gate electrode 30 is disposed on the gate insulating layer 28. A gate insulating layer 28 is disposed between the gate electrode 30 and the termination region 40.

The interlayer insulating film 32 is formed on the gate electrode 30. The interlayer insulating film 32 is made of, for example, a silicon oxide film.

The emitter electrode 134 is electrically connected to the emitter region 118 and the p-well contact region 20. The emitter electrode 134 also functions as a p-well electrode for applying a potential to the p-well region 16. The emitter electrode 134 is in contact with the silicon carbide layer 10.

The collector electrode 136 is electrically connected to the collector region 112. The collector electrode 136 is disposed on the side of the rear surface P2 of the silicon carbide layer 10. The collector electrode 136 is in contact with the silicon carbide layer 10.

The nitrogen region 60 is disposed in the silicon carbide layer 10. The nitrogen region 60 is disposed adjacent to the front surface P1 of the silicon carbide layer 10. The nitrogen region 60 is in contact with the front surface P1 of the silicon carbide layer 10.

The termination region 40 is disposed between the nitrogen region 60 and the gate insulating layer 28. The termination region 40 is disposed in the vicinity of the interface between the silicon carbide layer 10 and the gate insulating layer 28.

According to the third embodiment, the presence of the nitrogen region 60 and the termination region 40 allows the same functions and effects as those of the first embodiment to be obtained. Therefore, the IGBT 300 having a high carrier mobility and a low on-resistance is fabricated, and the method for manufacturing such an IGBT 300 is achieved.

Fourth Embodiment

An inverter circuit and a driving device of a fourth embodiment are disposed as a driving device including the semiconductor device of the first embodiment.

FIG. 15 is a schematic diagram of a driving device of the fourth embodiment. A driving device 400 includes a motor 140 and an inverter circuit 150.

The inverter circuit 150 includes three semiconductor modules 150a, 150b, 150c using the MOSFET 100 of the first embodiment as a switching element. By connecting the three semiconductor modules 150a, 150b, and 150c in parallel, a three-phase inverter circuit 150 having three AC voltage output terminals U, V, W is fabricated. The AC voltage output from the inverter circuit 150 drives the motor 140.

According to the fourth embodiment, the characteristics of the inverter circuit 150 and the driving device 400 are improved by including the MOSFET 100 having improved characteristics.

Fifth Embodiment

A vehicle of a fifth embodiment is a vehicle including the semiconductor device of the first embodiment.

FIG. 16 is a schematic diagram of a vehicle of the fifth embodiment. A vehicle 500 of the fifth embodiment is a railway vehicle. The vehicle 500 includes a motor 140 and an inverter circuit 150.

The inverter circuit 150 is composed of three semiconductor modules using the MOSFET 100 of the first embodiment as a switching element. By connecting three semiconductor modules in parallel, a three-phase inverter circuit 150 having three AC voltage output terminals U, V, W is realized. The AC voltage output from the inverter circuit 150 drives the motor 140. Wheels 90 of the vehicle 500 are rotated by the motor 140.

According to the fifth embodiment, the characteristics of the vehicle 500 are improved by providing the MOSFET 100 having improved characteristics.

Sixth Embodiment

A vehicle of the sixth embodiment is a vehicle including the semiconductor device of the first embodiment.

FIG. 17 is a schematic diagram of a vehicle according to a sixth embodiment. A vehicle 600 of the sixth embodiment is an automobile. The vehicle 600 includes the motor 140 and the inverter circuit 150.

The inverter circuit 150 is composed of three semiconductor modules using the MOSFET 100 of the first embodiment as a switching element. By connecting three semiconductor modules in parallel, a three-phase inverter circuit 150 having three AC voltage output terminals U, V, W is realized.

The AC voltage output from the inverter circuit 150 drives the motor 140. The wheels 90 of the vehicle 600 are rotated by the motor 140.

According to the sixth embodiment, by providing the MOSFET 100 with improved characteristics, the characteristics of the vehicle 600 are improved.

Seventh Embodiment

An elevator of a seventh embodiment is an elevator including the semiconductor device of the first embodiment.

FIG. 18 is a schematic diagram of the elevator of the seventh embodiment. An elevator 700 of the seventh embodiment includes a basket 610, a counterweight 612, a wire rope 614, a hoisting machine 616, the motor 140, and the inverter circuit 150.

The inverter circuit 150 is composed of three semiconductor modules using the MOSFET 100 of the first embodiment as a switching element. By connecting three semiconductor modules in parallel, a three-phase inverter circuit 150 having three AC voltage output terminals U, V, W is realized.

The AC voltage output from the inverter circuit 150 drives the motor 140. The hoisting machine 616 is rotated by the motor 140 to move up/down the basket 610.

According to the seventh embodiment, the characteristics of the elevator 700 are improved by including the MOSFET 100 having the improved characteristics.

Although 4H—SiC crystal structure of silicon carbide has been described as an example in the first embodiment, the present disclosure can also be applied to other crystal structures of silicon carbide, such as 6H—SiC or 3C—SiC.

In the first to third embodiments, the transistor structure using electrons as carriers has been described as an example. However, the present disclosure can also be applied to, for example, a transistor structure in which the silicon carbide layer in the channel region is n-type and holes are used as carriers. Even when the holes are used as carriers, the mobility of holes is improved by reducing the localized state due to the VcNN structure and increasing the unevenness of the lower end of the conduction band CB and the upper end of the valence band VB.

In the fifth to seventh embodiments, the semiconductor device of the present disclosure has been applied to the vehicle or elevator as an example, but the semiconductor device of the present disclosure can also be applied to, for example, a power conditioner of a solar power generation system.

While certain embodiments have been described, these embodiments have been presented by way of example only, and are not intended to limit the scope of the inventions. Indeed, the semiconductor device, the method for manufacturing the semiconductor device, the inverter circuit, the driving device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a silicon carbide layer;
   a gate electrode;
   a gate insulating layer disposed between the silicon carbide layer and the gate electrode;
   a first region disposed in the silicon carbide layer and containing nitrogen (N); and
   a second region disposed between the first region and the gate insulating layer, and containing at least one element selected from the group consisting of nitrogen (N), phosphorus (P), arsenic (As), antimony (Sb), scandium (Sc), yttrium (Y), lanthanum (La), lanthanoids (Ce, Pr, Nd, Pm, Sm, Eu, Gd, Tb, Dy, Ho, Er, Tm, Yb, Lu), hydrogen (H), deuterium (D), and fluorine (F),
   wherein
   a full width at half maximum of a concentration distribution of nitrogen in the first region is 1.5 nm or more and 5 nm or less.

2. The semiconductor device according to claim 1, wherein
   a peak concentration of nitrogen in the first region is $1\times10^{17}$ cm$^{-3}$ or more and $1\times10$ cm$^{-3}$ or less.

3. The semiconductor device according to claim 1, wherein a peak concentration of the at least one element in the second region is $1\times10^{18}$ cm$^{-3}$ or more and $1\times10^{23}$ cm$^{-3}$ or less.

4. The semiconductor device according to claim 1, wherein
a distance between a peak position of a concentration distribution of nitrogen in the first region and a peak position of a concentration distribution of the at least one element in the second region is 10 nm or less.

5. A semiconductor device, comprising:
a silicon carbide layer;
a gate electrode;
a gate insulating layer disposed between the silicon carbide layer and the gate electrode;
a first region disposed in the silicon carbide layer and containing nitrogen (N); and
a second region disposed between the first region and the gate insulating layer, and containing at least one element selected from the group consisting of nitrogen (N), phosphorus (P), arsenic (As), antimony (Sb), scandium (Sc), yttrium (Y), lanthanum (La), lanthanoids (Ce, Pr, Nd, Pm, Sm, Eu, Gd, Tb, Dy, Ho, Er, Tm, Yb, Lu), hydrogen (H), deuterium (D), and fluorine (F), wherein
the first region includes
a first nitrogen atom bonded to two silicon atoms and a second nitrogen atom bonded to the first nitrogen atom and also bonded to two silicon atoms.

6. A semiconductor device, comprising:
a silicon carbide layer;
a gate electrode;
a gate insulating layer disposed between the silicon carbide layer and the gate electrode;
a first region disposed in the silicon carbide layer and containing nitrogen (N); and
a second region disposed between the first region and the gate insulating layer, and containing at least one element selected from the group consisting of nitrogen (N), phosphorus (P), arsenic (As), antimony (Sb), scandium (Sc), yttrium (Y), lanthanum (La), lanthanoids (Ce, Pr, Nd, Pm, Sm, Eu, Gd, Tb, Dy, Ho, Er, Tm, Yb, Lu), hydrogen (H), deuterium (D), and fluorine (F), wherein
two nitrogen atoms in the first region are located at a carbon position of a silicon carbide crystal lattice.

7. The semiconductor device according to claim 1, wherein
the first region is made of p-type silicon carbide.

8. The semiconductor device according to claim 1, wherein
the gate insulating layer is made of silicon oxide.

9. A semiconductor device, comprising:
a silicon carbide layer;
a gate electrode;
a gate insulating layer disposed between the silicon carbide layer and the gate electrode; and
a region disposed in the silicon carbide layer and containing nitrogen (N), the region disposed adjacent to the gate insulating layer, a full width at half maximum of a concentration distribution of nitrogen in the region being 1.5 nm or more and 5 nm or less.

10. The semiconductor device according to claim 9, wherein
a peak concentration of nitrogen in the region is $1\times10^{17}$ cm$^{-3}$ or more and $1\times10^{22}$ cm$^{-3}$ or less.

11. A semiconductor device, comprising:
a silicon carbide layer;
a gate electrode;
a gate insulating layer disposed between the silicon carbide layer and the gate electrode; and
a region disposed in the silicon carbide layer and containing nitrogen (N), the region disposed adjacent to the gate insulating layer, the region having a first nitrogen atom bonded to two silicon atoms and a second nitrogen atom bonded to the first nitrogen atom and also bonded to two silicon atoms.

12. The semiconductor device according to claim 11, wherein
a peak concentration of nitrogen in the region is $1\times10^{17}$ cm$^{-3}$ or more and $1\times10^{22}$ cm$^{-3}$ or less.

13. An inverter circuit, comprising:
the semiconductor device according to claim 1.

14. A driving device, comprising:
the semiconductor device according to claim 1.

15. A vehicle, comprising:
the semiconductor device according to claim 1.

16. An elevator, comprising:
the semiconductor device according to claim 1.

17. A method for manufacturing a semiconductor device, comprising:
forming a first region including nitrogen by performing heat treatment on a silicon carbide layer having an exposed surface at a temperature of 1300° C. or more and 1400° C. or less in an $N_2$ gas having an oxygen partial pressure of 0.1 ppm or less;
forming a gate insulating layer on the silicon carbide layer after the forming the first region; and
forming a gate electrode on the gate insulating layer.

18. The method according to claim 17, wherein
the surface is subjected to hydrogen plasma treatment or an electron beam irradiation before the forming the first region.

19. The method according to claim 17, further comprising:
forming a second region containing at least one element selected from the group consisting of nitrogen (N), phosphorus (P), arsenic (As), antimony (Sb), scandium (Sc), yttrium (Y), lanthanum (La), lanthanoids (Ce, Pr, Nd, Pm, Sm, Eu, Gd, Tb, Dy, Ho, Er, Tm, Yb, Lu), hydrogen (H), deuterium (D), and fluorine (F) between the gate insulating layer and the first region.

20. The semiconductor device according to claim 5, wherein
a peak concentration of nitrogen in the first region is $1\times10^{17}$ cm$^{-3}$ or more and $1\times10^{22}$ cm$^{-3}$ or less.

21. The semiconductor device according to claim 5, wherein
a peak concentration of the at least one element in the second region is $1\times10^{18}$ cm$^{-3}$ or more and $1\times10^{23}$ cm$^{-3}$ or less.

22. The semiconductor device according to claim 6, wherein
a peak concentration of nitrogen in the first region is $1\times10^{17}$ cm$^{-3}$ or more and $1\times10^{22}$ cm$^{-3}$ or less.

23. The semiconductor device according to claim 6, wherein
a peak concentration of the at least one element in the second region is $1\times10^{18}$ cm$^{-3}$ or more and $1\times10^{23}$ cm$^{-3}$ or less.

* * * * *